(12) United States Patent
Judson et al.

(10) Patent No.: US 8,606,211 B2
(45) Date of Patent: Dec. 10, 2013

(54) HIGH DYNAMIC RANGE RECEIVER FRONT-END WITH Q-ENHANCEMENT

(75) Inventors: Bruce A. Judson, San Luis Obispo, CA (US); Cong T. Nguyen, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 816 days.

(21) Appl. No.: 12/490,268

(22) Filed: Jun. 23, 2009

(65) Prior Publication Data
US 2010/0323654 A1    Dec. 23, 2010

(51) Int. Cl.
*H04B 1/16* (2006.01)

(52) U.S. Cl.
USPC ............ 455/334; 455/307; 455/323; 333/175

(58) Field of Classification Search
USPC .............. 455/307, 323, 334, 339–341, 550.1; 333/172–175
See application file for complete search history.

(56) References Cited

U.S. PATENT DOCUMENTS

| | | | |
|---|---|---|---|
| 4,740,716 A * | 4/1988 | Silverman | 327/552 |
| 5,550,520 A * | 8/1996 | Kobayashi | 333/213 |
| 7,539,471 B2 * | 5/2009 | Zhan et al. | 455/130 |
| 2004/0028215 A1 | 2/2004 | Lee | |
| 2005/0248416 A1 | 11/2005 | Mattisson et al. | |

FOREIGN PATENT DOCUMENTS

| | | |
|---|---|---|
| JP | 2001257728 A | 9/2001 |
| JP | 2007150803 A | 6/2007 |
| TW | 200910373 A | 3/2009 |
| TW | 200913476 A | 3/2009 |
| WO | WO0070757 | 11/2000 |

OTHER PUBLICATIONS

Kuhn, W.B.; Yanduru, N.K.; Wyszynski, A.S.; "Q-enhanced LC bandpass filters for integrated wireless applications", Microwave Theory and Techniques, IEEE Transactions on; vol. 46, Issue 12, Part 2, Dec. 1998 pp. 2577-2586.
International Search Report and Written Opinion—PCT/US2010/039624, International Search Authority—European Patent Office—Oct. 26, 2010.
Taiwan Search Report—TW099120517—TIPO—Apr. 11, 2013.

* cited by examiner

*Primary Examiner* — Nhan Le
(74) *Attorney, Agent, or Firm* — Ramin Mobarhan

(57) ABSTRACT

A preselect circuit maintains the dynamic range of a received RF input signal during bandpass filtering of the received RF input signal. The preselect circuit includes a Q-deficient passive bandpass filter for coupling to an antenna to receive a received RF input signal. The preselect circuit further includes a Q-enhancement circuit coupled to the Q-deficient passive bandpass filter, wherein the Q-enhancement circuit increases a Q-value of the Q-deficient passive bandpass filter by compensating for resistive inductive losses in the bandpass filter.

22 Claims, 6 Drawing Sheets

HIGH DYNAMIC RANGE RECEIVER FRONT-END WITH Q-ENHANCEMENT

BACKGROUND

1. Field

This disclosure relates generally to wireless communication devices, and more specifically to improving the dynamic range on the input of a receiver.

2. Background

Communication receivers receive both desirable and undesirable signals on their inputs. Signal selection filters for a receiver's "front-end", such as preselect filters, have been designed for passing the desired signals relatively unfiltered and attenuating the undesired signals. The effectiveness of signal selection by a preselector is determined by the Q-value of a preselector's passband filter. Generally larger components in a passband filter may provide an adequate Q-value for providing the desired passband filtering. Conventionally, if the Q-value was inadequate, then larger, higher Q-value components were substituted until the preselector's passband filter provided adequate signal rejection.

As communication receivers became portable and mobile, various components in the receiver, including the receiver's front-end, have been integrated. Design tradeoffs exist between integration of receiver front-end components, such as passband filters, and the reduction in the effectiveness or quality of signal selection and rejection based upon the reduction of the Q-value of the filter components.

While it is desirable to further integrate the components of a receiver, attempts to further integrate bandpass filters results in inferior performance of the system. System requirements of narrow bandwidths, low distortion and the need for low-power consumption run counter to conventional integration approaches.

Further integration attempts have placed buffer components at the beginning of the receiver front-end resulting in a reduction of the dynamic range of the receiver front-end since buffer components include active devices which operate linearly only over a defined input signal dynamic range. Accordingly, when an RF input signal received at the receiver front-end includes undesired signals (jammer signals) of unpredictable magnitudes, then the active devices on a receiver's front-end may saturate, generate intermodulation signals and other non-linearities which may distort the desired input signal.

Larger off-chip circuit elements have allowed system requirements to be attained. However, larger-dimensioned circuit elements inhibit reductions in the overall dimensions of the device as well as contributes to increased device costs. Integration attempts may reduce the overall circuit component dimensions, however, such designs include shortcomings including difficulties achieving high operating frequencies with narrow bandwidths (i.e., high Q values) and a fundamental limitation on the dynamic range at high Q values.

Different receiver architectures (e.g., direct conversion or low IF designs) have attempted to overcome further integration shortcomings of passive components, however, the limitations on the dynamic range is prohibitive. For example, moving the channel select filtering to baseband results in amplifiers (e.g., Low Noise Amplifiers (LNAs)) and mixer circuits processing the entire RF spectrum including jamming (blocking) signals, resulting in the generation of further spurious responses and further desensitizing the receiver.

Improvements to poor dynamic range are possible by undesirably increasing the current consumption of circuit elements. For portable or mobile receivers, improving the dynamic range by increasing power consumption is undesirable and impractical. As stated, a bandpass filter includes passive elements (e.g., L/C, transmission lines, acoustic resonators) which in a bulk manufacturing quantities and integrated implementations results in very low Q-values for the bandpass filter. Accordingly, there is a need in the art for a receiver having a receiver front-end that exhibits high dynamic range on its inputs.

SUMMARY

Embodiments disclosed herein address the above stated needs by providing a preselect circuit exhibiting a high dynamic range during bandpass filtering. In one aspect of the disclosed embodiments, a preselect circuit includes a Q-deficient passive bandpass filter for coupling to an antenna to receive a received RF input signal. The preselect circuit further includes a Q-enhancement circuit coupled to the Q-deficient passive bandpass filter, wherein the Q-enhancement circuit increases a Q-value of the Q-deficient passive bandpass filter by compensating for resistive inductive losses in the bandpass filter.

In another aspect of the disclosed embodiments, a receiver includes a preselector and mixer coupled to the preselect to down-convert a preselect filtered RF input signal. The preselector includes a Q-deficient passive bandpass filter for coupling to an antenna to receive a received RF input signal and a Q-enhancement circuit coupled to the Q-deficient passive bandpass filter. The Q-enhancement circuit is configured to increase a Q-value of the Q-deficient passive bandpass filter by compensating for resistive inductive losses in the bandpass filter.

In another aspect of the disclosed embodiments, a wireless communication device includes an antenna and a receiver coupled to the antenna. The receiver includes a Q-deficient passive bandpass filter for coupling to the antenna to receive a received RF input signal and a Q-enhancement circuit coupled to the Q-deficient passive bandpass filter. The Q-enhancement circuit is configured to increase a Q-value of the Q-deficient passive bandpass filter by compensating for resistive inductive losses in the bandpass filter.

In another aspect of the disclosed embodiments, a method for preselecting a received input signal includes receiving an RF input signal from an antenna and passively bandpass filtering the RF input signal in a Q-deficient passive bandpass filter prior to the RF input signal being subjected to any active circuit elements. The method further includes enhancing a deficient Q-value of the Q-deficient passive bandpass filter.

DETAILED DESCRIPTION

Figure 1:
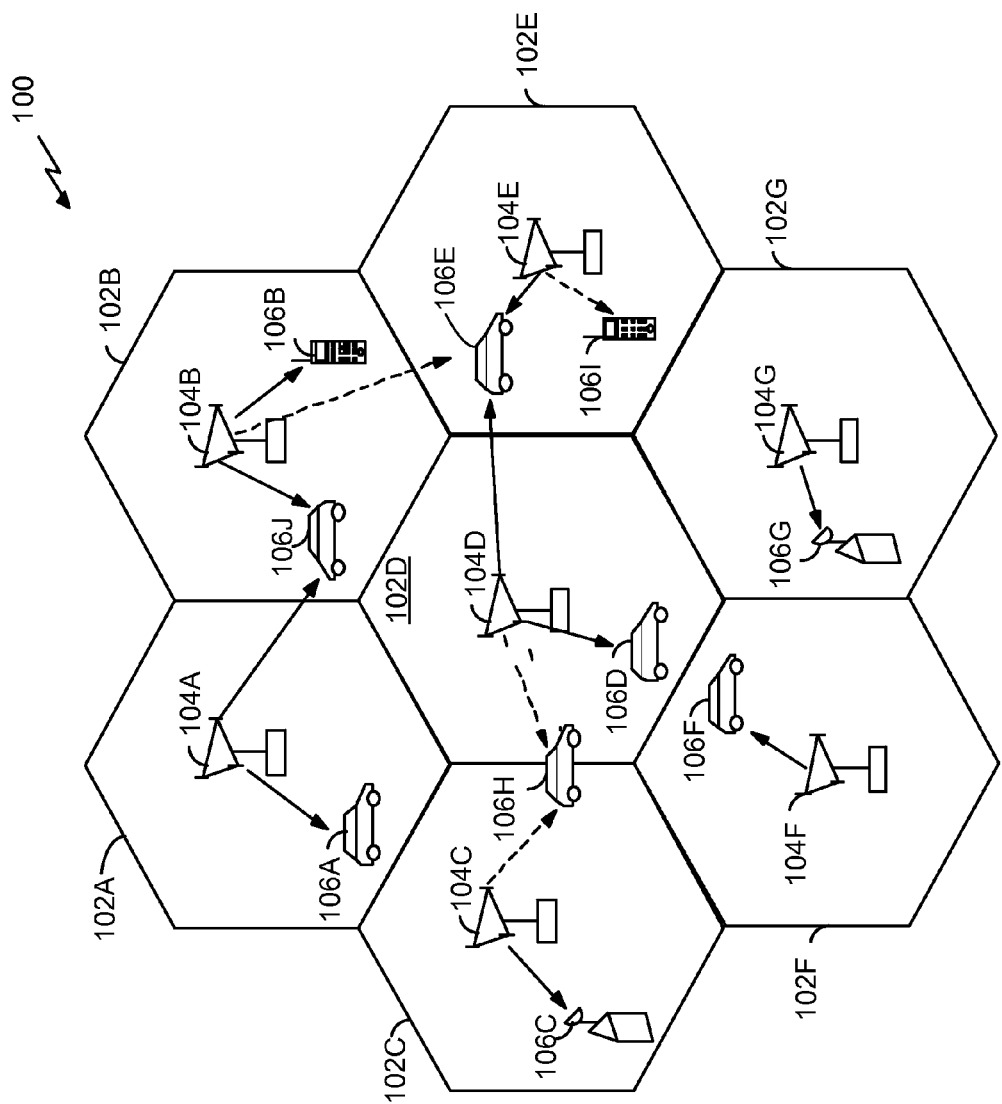
FIG. 1 illustrates an example of a communications system that supports a number of users and is capable of implementing at least some aspects of the embodiments discussed herein.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

The word "exemplary" is used herein to mean "serving as an example, instance, or illustration." Any embodiment described herein as "exemplary" is not necessarily to be construed as preferred or advantageous over other embodiments.

Note that the exemplary embodiment is provided as an exemplar throughout this discussion, however, alternate embodiments may incorporate various aspects without departing from the scope of the present embodiments. Specifically, one embodiment is applicable to a data processing system, a wireless communication system, a mobile IP network and any other system desiring to receive and process a wireless signal.

Circuits and devices described herein may operate in wireless communication systems. Wireless communication systems are widely deployed to provide various types of communication such as voice, data, and so on. These systems may be based on Code Division-Multiple Access (CDMA), Time Division-Multiple Access (TDMA), or some other modulation techniques. A CDMA system provides certain advantages over other types of systems, including increased system capacity.

A wireless communication system, including the circuits and devices described herein, may be designed to support one or more standards such as the "TIA/EIA/IS-95-B Mobile Station-Base Station Compatibility Standard for Dual-Mode Wideband Spread Spectrum Cellular System" referred to herein as the IS-95 standard, the standard offered by a consortium named "3rd Generation Partnership Project" referred to herein as 3GPP, and embodied in a set of documents including Document Nos. 3GPP TS 25.211, 3GPP TS 25.212, 3GPP TS 25.213, and 3GPP TS 25.214, 3GPP TS 25.302, referred to herein as the W-CDMA standard, the standard offered by a consortium named "3rd Generation Partnership Project 2" referred to herein as 3GPP2, and TR-45.5 referred to herein as the cdma2000 standard, formerly called IS-2000 MC.

The circuits, devices, systems and methods described herein may be used with High Data Rate (HDR) communication systems. An HDR communication system may be designed to conform to one or more standards such as the "cdma2000 High Rate Packet Data Air Interface Specification," 3GPP2 C.S0024-A, Version 1, March 2004, promulgated by the consortium "3rd Generation Partnership Project 2." The contents of the aforementioned standard are incorporated by reference herein.

An HDR subscriber station, which may be referred to herein as an Access Terminal (AT), may be mobile or stationary, and may communicate with one or more HDR base stations, which may be referred to herein as Modem Pool Transceivers (MPTs). An access terminal transmits and receives data packets through one or more modem pool transceivers to an HDR base station controller, which may be referred to herein as a Modem Pool Controller (MPC). Modem pool transceivers and modem pool controllers are parts of a network called an access network. An access network transports data packets between multiple access terminals. The access network may be further connected to additional networks outside the access network, such as a corporate intranet or the Internet, and may transport data packets between each access terminal and such outside networks. An access terminal may be any data device that communicates through a wireless channel or through a wired channel, for example using fiber optic or coaxial cables. An access terminal may further be any of a number of types of devices including but not limited to PC card, compact flash, external or internal modem, or wireless or landline phone. The communication channel through which the access terminal sends signals to the modem pool transceiver is called a reverse channel. The communication channel through which a modem pool transceiver sends signals to an access terminal is called a forward channel.

FIG. 1 illustrates an example of a communications system 100 that supports a number of users and is capable of implementing at least some aspects of the embodiments discussed herein. Any of a variety of algorithms and methods may be used to schedule transmissions in system 100. System 100 provides communication for a number of cells 102A-102G, each of which is serviced by a corresponding base station 104A-104G, respectively.

Wireless communication devices 106 in the coverage area may be fixed (i.e., stationary) or mobile. As shown in FIG. 1, various wireless communication devices 106 are dispersed throughout the system. Each wireless communication device 106 communicates with at least one and possibly more base stations 104 on a forward link and a reverse link at any given moment depending on, for example, whether soft handoff is employed or whether the terminal is designed and operated to (concurrently or sequentially) receive multiple transmissions from multiple base stations.

The forward link refers to transmission from a base station 104 to a wireless communication device 106, and the reverse link refers to transmission from a wireless communication device 106 to a base station 104. In FIG. 1, base station 104A transmits data to wireless communication devices 106A and 106J on a forward link; similarly base station 104B transmits data to wireless communication devices 106B and 106J, base station 104C transmits data to wireless communication device 106C, and so on.

Figure 2:
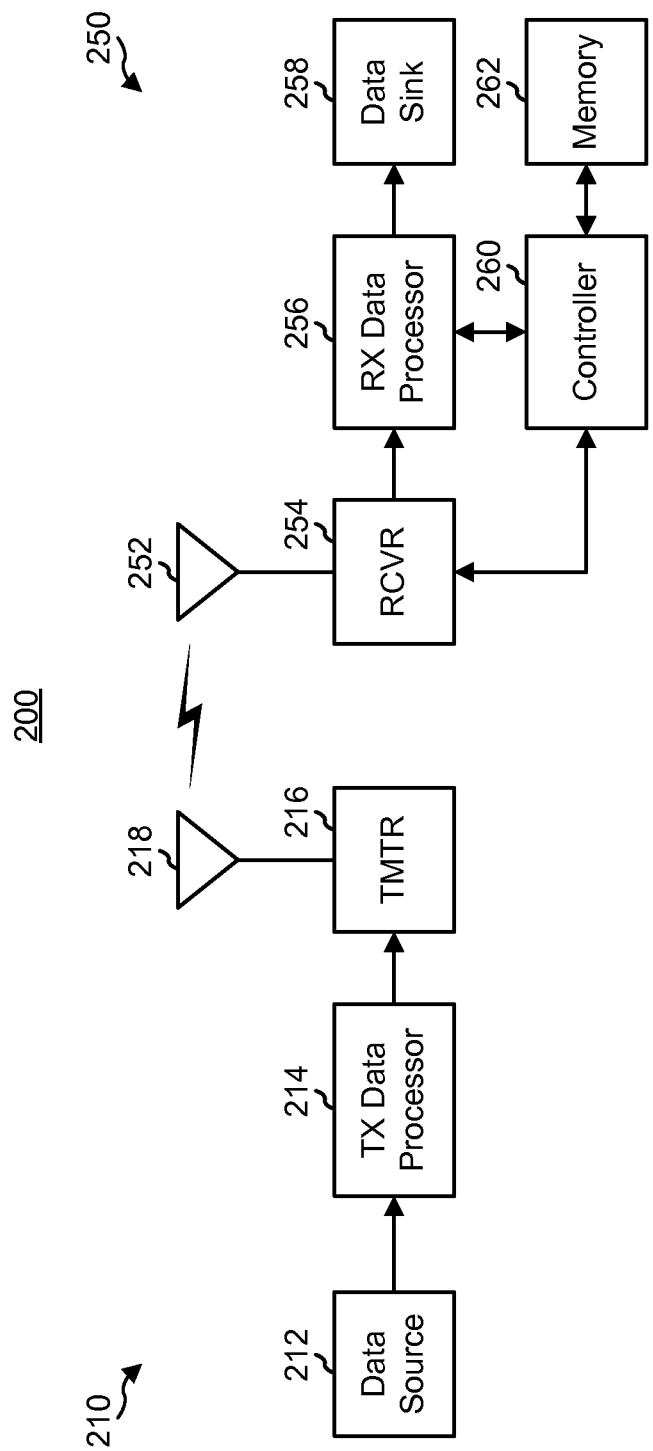
FIG. 2 is a block diagram of a transmitter system and a receiver system in a wireless communication system capable of implementing at least some aspects of the embodiments discussed herein.

FIG. 2 is a block diagram of a transmitter system 210 and a receiver system 250 in a wireless communication system 200. At transmitter system 210, traffic data is sent (typically in packets that may be of variable lengths) from a data source 212 to a Transmit (TX) data processor 214. TX data processor 214 then formats and codes the traffic data to provide coded data. The coded data is then modulated (i.e., symbol mapped) based on one or more modulation schemes (e.g., BPSK, QSPK, M-PSK, or M-QAM) to provide modulation symbols (i.e., modulated data).

A Transmitter (TMTR) unit 216 then converts the modulated data into one or more analog signals and further amplifies, filters, quadrature modulates, and upconverts the analog signals to generate a modulated signal. The modulated signal is then transmitted via an antenna 218 and over a wireless communication link to one or more receiver systems.

At receiver system 250, the transmitted modulated signal is received by an antenna 252 and provided to a receiver (RCVR) 254. Within receiver 254, the received signal is conditioned (e.g., filter, amplified, frequency downconverted, and quadrature downconverted) and the conditioned signal is further digitized to provide ADC samples. The Analog-to-Digital Converter (ADC) samples may further be digitally pre-processed within receiver 254 to provide data samples. Receiver 254 includes a preselector, described below, in accordance with various aspects of the embodiments described herein.

A Receive (RX) data processor 256 then receives and processes the data samples to provide decoded data, which is an estimate of the transmitted data. The processing by RX data processor 256 may include, for example, equalization, demodulation, deinterleaving, and decoding. The processing at RX data processor 256 is performed in a manner that is complementary to the processing performed at TX data processor 214. The decoded data is then provided to a data sink 258.

A controller 260 directs the operation at the receiver system. A memory unit 262 provides storage for program codes and data used by controller 260 and possibly other units within the receiver system.

The signal processing described above supports transmissions of various types of traffic data (e.g., voice, video, packet data, and so on) in one direction from the transmitter system to the receiver system. A bi-directional communication system supports two-way data transmission. The processing shown in FIG. 2 can represent the forward link (i.e., downlink) processing in a CDMA system, in which case, transmitter system 210 can represent a base station and receiver system 254 can represent a terminal. The signal processing for the reverse link (i.e., uplink) is not shown in FIG. 2 for simplicity.

Figure 3:
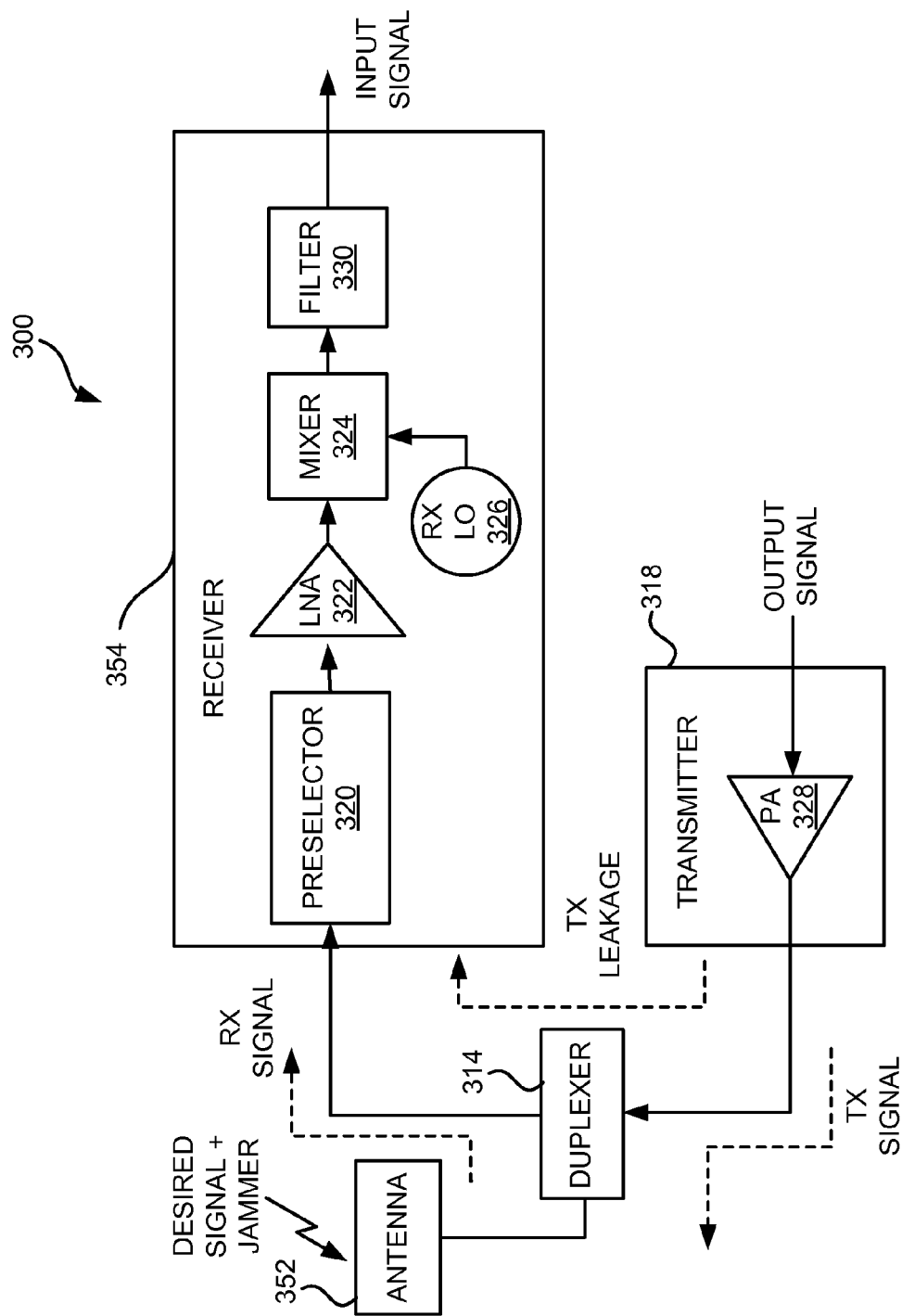
FIG. 3 is a block diagram illustrating an RF section of a wireless communication device including a preselector capable of implementing at least some aspects of the embodiments discussed herein.

FIG. 3 is a block diagram of one aspect illustrating an exemplary RF section of a wireless communication device 300 including the receive system 250 of FIG. 2. Wireless communication device 300 may be any of a variety of mobile or stationary devices with wireless capabilities, such as a cellular radiotelephone, satellite phone, smart phone, personal digital assistant (PDA), mobile or desktop computer, digital video or audio device, gaming console, television console, a set top box, or any other device equipped for wireless communication.

As shown in FIG. 3, device 300 includes an antenna 352 that transmits and receives wireless RF signals. A duplexer 314 couples RX signals (RX SIGNAL) received by antenna 352 to a receiver 354, and couples TX output signals (TX SIGNAL) generated by a transmitter 318 to antenna 352. In the example of FIG. 3, receiver 354 includes preselector 320, low noise amplifier (LNA) 333, mixer 324, local oscillator (LO) 326, and a filter 330. Transmitter 318 includes a power amplifier 328 that amplifies an RF output signal to produce a TX RF signal for transmission via duplexer 314 and antenna 352. Transmitter 318 also may include a modem, digital-to-analog converter, mixer and filter circuitry (not shown) to modulate and filter the output signal, and up-convert the signal from a baseband to a transmit band.

In receiver 354, preselector 320 filters and amplifies the RX signal and is further described below. In receiver 354, LNA 322 amplifies the RX signal. LNA 322 may be a differential amplifier producing differential output signals. Mixer 324 may be a wideband mixer that multiplies the amplified, signal from preselector 320 with the RX LO frequency to down-convert the desired RX signal to baseband, thereby producing an RX baseband signal. Filter 330 filters the RX baseband signal to reduce the TX leakage signal and thereby reduce undesirable distortion. Filter 330 may provide further filtering (i.e., a notch frequency filter) at which the TX signal is strongly attenuated. Filter 330 may be configured such that the notch frequency generally corresponds to the offset frequency of the down-converted TX leakage signal relative to the center frequency (e.g., 0 Hz) of the baseband. Filter 330 may also be configured to substantially reject frequencies outside the desired baseband. Receiver 354 may further include an analog-to-digital converter and modem (not shown) to demodulate and decode the desired RX signal.

Antenna 352 may receive a RX signals (RX SIGNAL) including both a desired signal and a jammer signal, as shown in FIG. 3. Hence, preselector 320 may receive an RX signal including the desired signal and possibly the jammer signal, as well as the TX leakage signal coupled from the transmit path via duplexer 314. Preselector 320 filters and amplifies this combined RX signal to produce an amplified RF signal. The TX leakage signal may produce second order distortion and cross modulation distortion (XMD). The jammer signal is an undesired signal that may correspond to a signal generated from a nearby source such as a wireless transmission station. In some cases, a jammer signal may have an amplitude that is much higher than that of the desired signal and may be located close in frequency to the desired signal. The TX leakage signal also may have a large amplitude relative to the desired signal because the transmit signal produced by power amplifier 328 is often much larger in amplitude than the desired signal.

The TX leakage signal is outside the RX band. However, TX leakage signal still may cause undesirable distortion. For example, any non-linearity in preselector 320 can cause the modulation of TX leakage signal to be transferred to the narrow-band jammer, resulting in a widened spectrum around the jammer. This spectral widening is referred to as cross modulation distortion (XMD). This XMD acts as additional noise that degrades the performance of the wireless communication device. This noise degrades sensitivity so that the smallest desired signal that can be reliably detected by receiver 354 needs to have a larger amplitude. XMD can also be generated in mixer 324.

In wideband receivers, the received RF signal (RX SIGNAL) may either be downconverted from a wide frequency range to a lower intermediate frequency (IF) using, for example, a super heterodyne receiver or directly downconverted to baseband according to, for example, a Zero Intermediate Frequency (ZIF) receiver. These receivers utilize a preselector 320 including a bandpass filter with a narrow bandwidth for preselection requiring a high-Q filter. Unfortunately, active bandpass filters may exhibit limited dynamic range or excessive current draw and, therefore, result in the inclusion of both desired RX signals and undesired received signals (e.g., jammer signals and TX leakage signal) in the RF amplification process.

Figure 4:
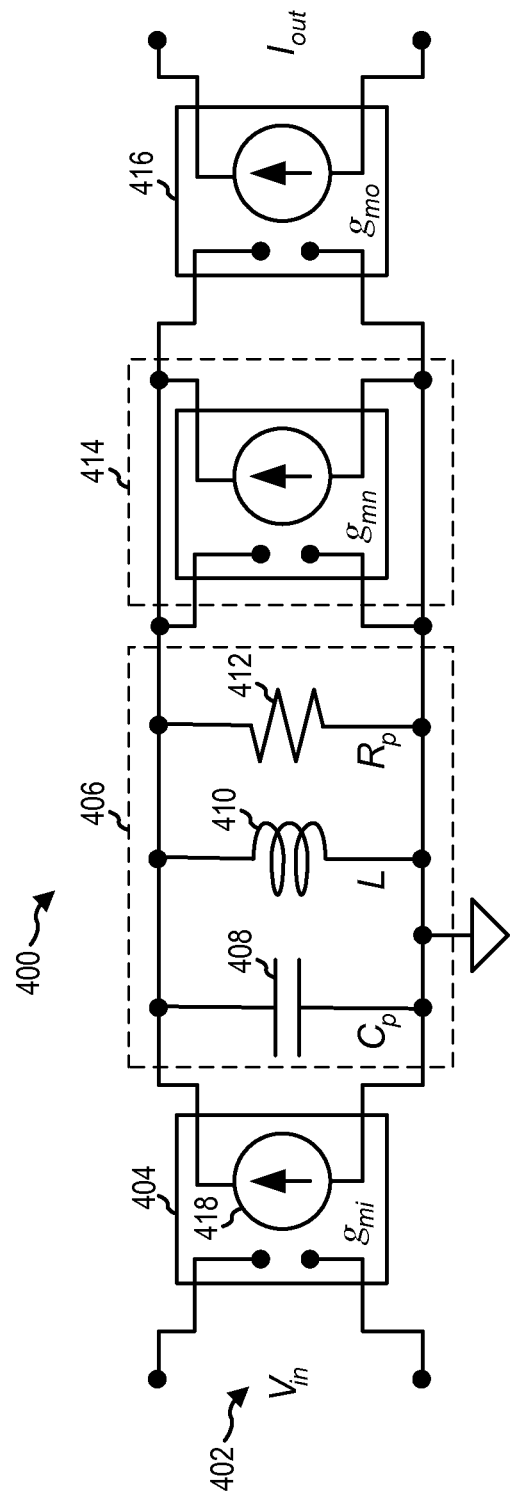
FIG. 4 is a circuit diagram illustrating a preselector including an active element at the input.

FIG. 4 illustrates a preselector 400 including an initial active element. Preselector 400 includes in an active input buffer 404 for receiving the RX signal (e.g., desired signal and any jammer signal) and the TX leakage signal (also collectively referred to herein as the "RF input signal 402"). The active input buffer 404 buffers and amplifies the RF input signal 402 to form an actively buffered RF input signal at node A.

The actively buffered RF input signal is subjected to a passive bandpass filter 406 including a capacitor C 408, an inductor L 410 including a resistive inductive loss illustrated as resistor Rp 412. In practical implementations of mobile or portable receivers, passive bandpass filters, such as passive bandpass filter 406, are implemented according to mass-produced passive components such as capacitors and inductors of reduced dimensions and tolerances. Reduced dimensions and tolerances of bandpass filter components results in a Q-deficient passive bandpass filter. A Q-deficient bandpass filter exhibits inadequate passband selection and out-of-band rejection of the RF input signal and high loss.

Conventionally, the Q-value of passive bandpass filters could be adequately increased based upon selection of higher Q-value capacitors and inductors or large resonate cavities, albeit of larger dimensions. However, in portable and mobile devices, the Q-value of a Q-deficient passive bandpass filter 406 may be augmented by a Q-enhancement circuit 414. In one aspect, the Q-enhancement circuit 414 is coupled in parallel to the resistive inductive loss resistor Rp 412 of the Q-deficient passive bandpass filter 406. The Q-enhancement circuit 414 may be configured as a negative resistor for compensating for the resistive inductive loss resistor Rp 412. The Q-enhancement circuit 414 may be implemented as a transconductance active device as illustrated.

Preselector 400 may further include an output buffer 416 coupled to the Q-deficient passive bandpass filter 406 and the Q-enhancement circuit 414. The output buffer 416 may provide impedance matching with the mixer 324 of FIG. 3.

One of the shortcomings of preselector 400 includes the active configuration of active input buffer 404. The active input buffer 404 includes a transistor 418 which directly receives the unpredictably fluctuating dynamic range (i.e., signal level magnitudes) of the RF input signal. For example, a high signal level of the RF input signal, such as a jamming signal, frequently exceeds the dynamic range of the transistor 418 resulting in saturation of transistor 418 causing the generation of distortion in the form of cross modulation distortion (XMD) discussed above. Accordingly, the active input buffer 404 restricts the dynamic range of the preselector 400. While the dynamic range of an active input buffer may be extended by providing excessive current to the active transistor, excessive and unnecessary power consumption runs counter to the prudent power management design goals for portable and mobile devices. Accordingly, due to the broad dynamic range requirements for a receiver 354 of FIG. 3, a high dynamic range preselector is desired.

Figure 5:
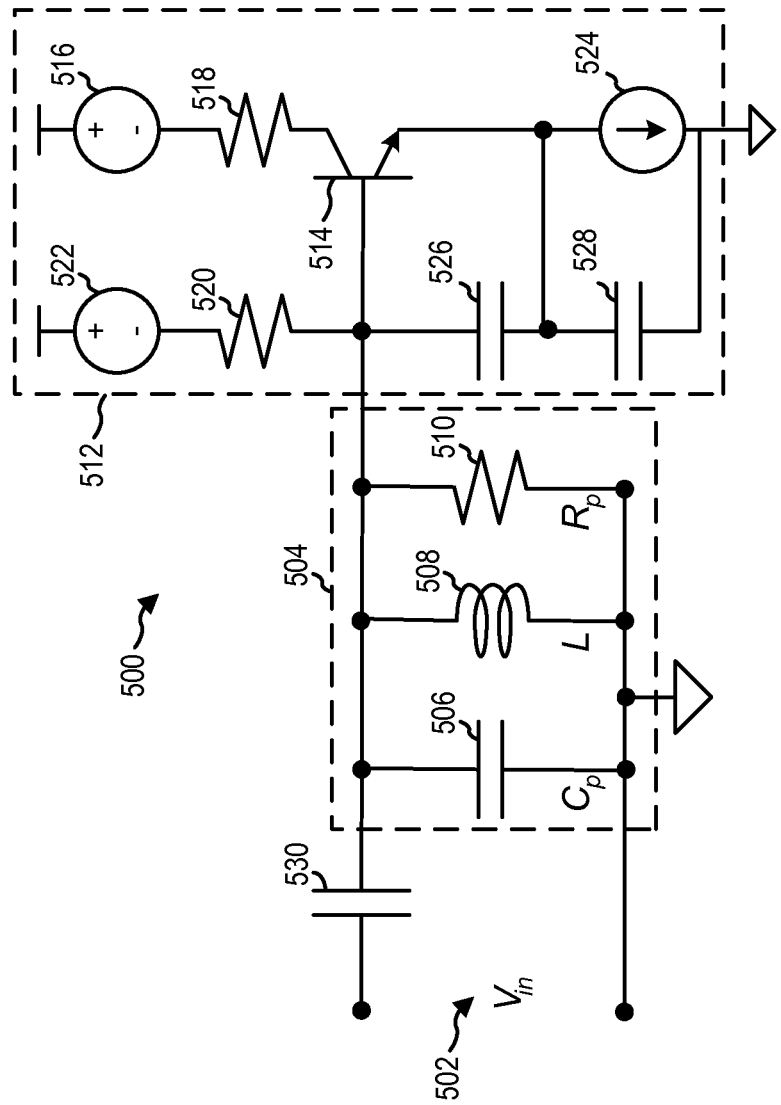
FIG. 5 is a circuit diagram illustrating a preselector including passive elements at an input capable of implementing at least some aspects of the embodiments discussed herein.

FIG. 5 illustrates a preselector in accordance with various aspects of the disclosed embodiments. Accordingly, a preselector 500 includes passive bandpass filtering with an acceptably narrow bandwidth attainable without unduly restricting the dynamic range. The preselector 500 receives an RF input signal 502 which is initially passed to a Q-deficient passive bandpass filter 504. The Q-deficient passive bandpass filter 504 is a resonator and may include different components include discrete inductors/capacitors, transmission lines, cavity resonators and acoustic resonators. The Q-deficient passive bandpass filter 504 is illustrated to include a capacitor C 506, an inductor L 508 including a resistive resonator loss illustrated as resistor Rp 510

The Q-deficient passive bandpass filter 504 includes only passive elements which provide a high dynamic range for filtering the entire RF input signal. Therefore, before the high dynamic range RF input signal encounters any active devices, it has already been filtered by the Q-deficient passive bandpass filter 504 which has rejected the out-of-band signals which would tend to exhibit the dynamic range extremes. The dynamic range is bounded by noise on the lower end of the range and by linearity of the devices on the upper end of the range. Passive devices such as passive capacitors and inductors introduce essentially no noise on the lower end of the dynamic range and do not become non-linear on the upper end of their dynamic range. In contrast, active devices, such as transistor 418 of FIG. 4, introduce noise on the lower end of their dynamic range and then saturates on the upper end of the dynamic range causing an introduction of non-linearities into the RF input signals. Accordingly, active devices have a much smaller dynamic range than passive devices and are therefore undesirable in receiver front-ends for passing signals that have not been initially filtered into the dynamic range of the active device.

Continuing reference to FIG. 5, the Q-deficient passive bandpass filter 504 is configured at the input of preselector 500 to receive the RF input signal prior to the RF input signal passing through any active devices. Furthermore, the preselector 500 is configured at the input of the receiver 354 of FIG. 3 to receive the received RF input signal (RX signal and TX leakage signal) prior to the RF input signal passing through any active devices. According to the various aspects of the embodiments disclosed herein, the RF input signal received at antenna 352 of FIG. 3 first passes through the Q-deficient passive bandpass filter 504 of FIG. 5 before passing through any active devices.

In operation, the received RF input signal (RX signal and TX leakage signal) first couples to the passive preselect filtering of Q-deficient passive bandpass filter 504 including the capacitor C 506 and the inductor L 508 before connection to any active device. Coupling the received RF input signal first to non-active circuitry results in a lower power configuration since an active circuit receiving a received RF signal (RX signal) would require high power in order to exhibit a large dynamic range. The Q-deficient passive bandpass filter 504 provides filtering of at least a portion of unwanted signals (e.g., jammer signals and TX leakage signal) thus reducing the dynamic range requirements of subsequent active devices in receiver 354 of FIG. 3.

It is noted that in mobile or portable devices including receivers, the reduction in physical dimensions of filter circuit components results in a reduction in the "Q-value" of the filter resulting from the filter circuit components. Accordingly, realization of reduced-dimension bandpass filters results in a reduction in the Q-value of the filters. As stated, one method for increasing the Q-value of a Q-deficient passive bandpass filter is to mitigate the resistive losses in the passive components of the passive bandpass filter by providing a negative resistance. Accordingly, preselector 500 further includes a Q-enhancement circuit 512 coupled in parallel to the resistive inductive loss resistor Rp 510 of the Q-deficient passive bandpass filter 504. The Q-enhancement circuit 512 may be configured as a negative resistor for compensating for the resistive inductive loss resistor Rp 510. The Q-enhancement circuit 512 may be implemented as a transconductance active device as illustrated in FIG. 5. Accordingly, the first active device through which the RF input signal passes is the active device in the Q-enhancement circuit 412 and not an active device associated with an active input buffer such as active input buffer 404 of FIG. 4 which includes transistor 404.

The Q-enhancement circuit may be variously configured. In one aspect, Q-enhancement circuit 512 is configured as a negative resistance to cancel the effect of losses, such as resistive inductive loss illustrated as resistor Rp 510. Positive feedback from Q-enhancement circuit 512 reduces the effect of losses in inductor loss resistance Rp 510. The amount of positive feedback is controlled by the ratio of capacitors 526 and 528 with the Q-value being determined by the feedback provided by the capacitors 526 and 528 as well as the current following through transistor 514. The losses of inductor 508 and capacitor 506 are modeled by the inductor loss resistance Rp 510.

In one aspect, the Q-enhancement circuit 512 is configured as a negative resistance circuit arranged in a Colpitts configuration. The Q-enhancement circuit 512 includes a transistor 514 having a collector coupled to a power source 516 via resistor 518. Resistor 518 can be replaced with an inductor. A first bias resistor 520 is coupled between a power source 522 and the base of the transistor 514. A current source 524 is coupled between the emitter of the transistor 514 and a ground potential. A first feedback capacitor 526 is coupled between the base and emitter of the transistor 514. A second feedback capacitor 528 is coupled between the emitter of the transistor 514 and the ground potential.

The preselector 500 may further include an impedance transformer 530 used to decouple the incoming RF input signal from the antenna 352 of FIG. 3. The impedance transformer 530 may be adjusted to match the electrical load of the antenna-side of the preselector 500 in order to maximize the power transfer and minimize reflections from the RF input signal, thus obtain the desired overall filter response.

Figure 6:
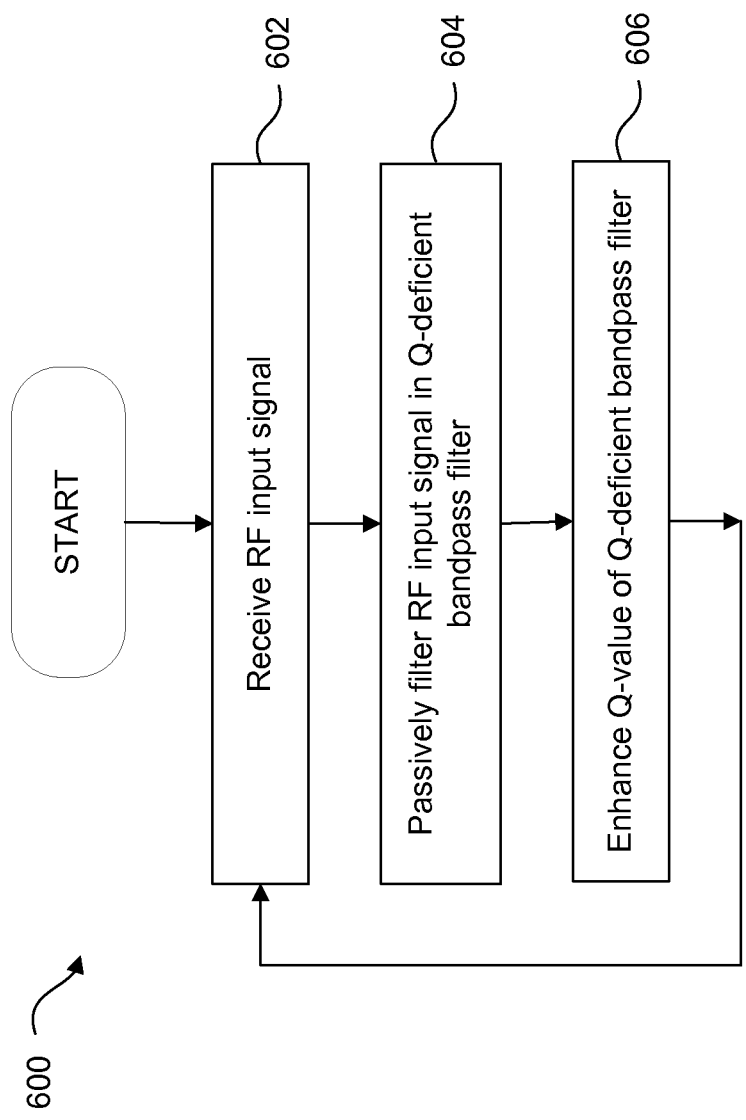
FIG. 6 is a flow diagram illustrating a method for receiving an input signal capable of implementing at least some aspects of the embodiments discussed herein.

FIG. 6 is a flow diagram illustrating a method for receiving an input signal capable of implementing at least some aspects of the embodiments discussed herein. A process 600 illustrates maintaining a high-dynamic range for a received RF input signal in a preselector circuit. In step 602, an RF input signal is received from the antenna and may pass through a duplexer 314 of FIG. 3 and an impedance transformer 530 of FIG. 5. As stated, the received RF input signal may include high-dynamic range signal levels on the RF input signals which would normally become distorted in a receiver front-end.

In a step 604, the received RF input signal is passively filtered in a Q-deficient bandpass filter. The Q-deficient passive bandpass filter includes only passive elements which provide a high dynamic range for filtering the entire RF input signal. Therefore, before the high dynamic range RF input signal encounters any active devices, it has already been filtered by the Q-deficient passive bandpass filter which has rejected the out-of-band signals which would tend to exhibit the dynamic range extremes. Passive devices such as passive capacitors and inductors introduce essentially no noise on the lower end of the dynamic range and do not become non-linear on the upper end of their dynamic range. In contrast, active devices, introduce noise on the lower end of their dynamic range and then saturates on the upper end of the dynamic range causing an introduction of non-linearities into the RF input signals.

In step 606, the Q-value of the Q-deficient bandpass filter is enhanced using a Q-enhancement circuit. As stated, in mobile or portable devices including receivers, the reduction in physical dimensions of filter circuit components results in a reduction in the narrowness of the bandwidth or Q-value of the filter resulting from the filter circuit components. Accordingly, realization of reduced-dimension bandpass filters results in a reduction in the Q-value of the filters. The Q-value is increased by mitigating the resistive losses in the passive components of the passive bandpass filter by providing a negative resistance. Accordingly, a Q-enhancement circuit is coupled in parallel to the resistive inductive loss resistor of the Q-deficient passive bandpass filter. Accordingly, the first active device through which the RF input signal passes is the active device in the Q-enhancement circuit and not an active device associated with an active input buffer.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A preselect circuit, comprising:
 a Q-deficient passive bandpass filter for coupling to an antenna to receive a received RF input signal; and
 a Q-enhancement circuit coupled to and controlled by an output of the Q-deficient passive bandpass filter, wherein the Q-enhancement circuit increases a Q-value of the Q-deficient passive bandpass filter by compensating for resistive inductive losses in the bandpass filter.

2. The circuit of claim 1, wherein the Q-deficient passive bandpass filter comprises a resonator configured as one of an LC tank circuit, transmission lines, cavity resonators and acoustic resonators.

3. The circuit of claim 1, wherein the Q-deficient passive bandpass filter comprises at least one discrete inductor and at least one discrete capacitor.

4. The circuit of claim 1, further comprising an impedance transformer coupling the received RF input signal to the Q-deficient passive bandpass filter.

5. The circuit of claim 1, wherein the Q-enhancement circuit includes an active device and the active device is the first active device through which the received RF input signal passes.

6. The circuit of claim 1, wherein the Q-enhancement circuit is formed as an integrated circuit and the Q-deficient passive bandpass filter is a discrete circuit.

7. The circuit of claim 1, wherein the Q-enhancement circuit is configured a Colpitts configuration.

8. The circuit of claim 1, further comprising an active buffer following the Q-enhancement circuit.

9. A receiver, comprising:
a preselector including:
a Q-deficient passive bandpass filter for coupling to an antenna to receive a received RF input signal; and
a Q-enhancement circuit coupled to and controlled by an output of the Q-deficient passive bandpass filter, wherein the Q-enhancement circuit increases a Q-value of the Q-deficient passive bandpass filter by compensating for resistive inductive losses in the bandpass filter; and
a mixer coupled to the preselector that down-converts a preselector filtered RF input signal.

10. The receiver of claim 9, further comprising an amplifier coupled between the preselector and the mixer that amplifies the preselector filtered RF input signal.

11. The receiver of claim 9, wherein the Q-deficient passive bandpass filter comprises a resonator configured as one of an LC tank circuit, transmission lines, cavity resonators and acoustic resonators.

12. The receiver of claim 9, wherein the Q-deficient passive bandpass filter comprises at least one discrete inductor and at least one discrete capacitor.

13. The receiver of claim 9, further comprising an impedance transformer coupling the received RF input signal to the Q-deficient passive bandpass filter.

14. The receiver of claim 9, wherein the Q-enhancement circuit includes an active device and the active device is the first active device through which the received RF input signal passes.

15. The receiver of claim 9, wherein the Q-enhancement circuit is formed as an integrated circuit and the Q-deficient passive bandpass filter is a discrete circuit.

16. The receiver of claim 9, wherein the Q-enhancement circuit is configured a Colpitts configuration.

17. The receiver of claim 9, further comprising an active buffer following the Q-enhancement circuit.

18. A wireless communication device, comprising:
an antenna; and
a receiver coupled to the antenna, the receiver including:
a Q-deficient passive bandpass filter for coupling to the antenna to receive a received RF input signal; and
a Q-enhancement circuit coupled to and controlled by an output of the Q-deficient passive bandpass filter, wherein the Q-enhancement circuit increases a Q-value of the Q-deficient passive bandpass filter by compensating for resistive inductive losses in the bandpass filter.

19. A method, comprising:
passively bandpass filtering an RF input signal in a Q-deficient passive bandpass filter prior to the RF input signal being subjected to any active circuit elements; and
increasing a Q-value of the Q-deficient passive bandpass filter by compensating for resistive and inductive losses in the bandpass filter using a Q-enhancement circuit coupled to and controlled by an output of the Q-deficient passive bandpass filter.

20. The method of claim 19, wherein the Q-deficient passive bandpass filter comprises one of a resonator configured as one of an LC tank circuit, transmission lines, cavity resonators, acoustic resonators and at least one discrete inductor and at least one discrete capacitor.

21. The method of claim 19, further comprising impedance transforming the received RF input signal to the Q-deficient passive bandpass filter.

22. A circuit, comprising:
means for passively bandpass filtering an RF input signal in a Q-deficient passive bandpass filter prior to the RF input signal being subjected to any active circuit elements; and
means for increasing a Q-value of the Q-deficient passive bandpass filter by compensating for resistive and inductive losses in the bandpass filter using a Q-enhancement circuit coupled to and controlled by an output of the Q-deficient passive bandpass filter.

* * * * *